United States Patent [19]

Woodman, Jr. et al.

[11] 4,119,206

[45] Oct. 10, 1978

[54] COMPONENT SEQUENCE VERIFIER

[75] Inventors: Daniel Wayne Woodman, Jr., Beverly, Mass.; Stanley Robert Vancelette, Manchester, N.H.

[73] Assignee: USM Corporation, Farmington, Conn.

[21] Appl. No.: 796,680

[22] Filed: May 13, 1977

[51] Int. Cl.² ............................................. B07C 5/08
[52] U.S. Cl. ................................. 209/548; 209/705; 198/339; 209/914
[58] Field of Search ................... 209/73, 81 R, 71, 72; 198/339, 343

[56] References Cited

U.S. PATENT DOCUMENTS

| 2,856,054 | 10/1958 | Fausset | 198/343 |
|---|---|---|---|
| 3,092,253 | 6/1963 | Senger | 209/81 R |
| 3,629,702 | 12/1971 | Henken | 209/81 R |

Primary Examiner—Allen N. Knowles

Attorney, Agent, or Firm—Carl E. Johnson; Richard B. Megley; Vincent A. White

[57] ABSTRACT

To enable a high-speed machine to process (for instance interconnect and reel) only acceptable, predeterminedly ordered electronic components after appropriate test, velocity changing mechanism actuatable by a continuously operable conveyor of the machine is provided to shift components to and from a testing unit and relative to their respective successive locations along the conveyor. Only failure of a component to qualify at the test unit automatically stops the conveyor, and that enables an operator to take corrective action by satisfactory completion of a test on a replacement component which then is preferably manually located in its proper sequence on the conveyor prior to re-starting of the machine. Accordingly, except for the usually uncommon short interval when an attendant may need to make substitution for an unsatisfactory component which has been detected, the invention enables rapid processing of assuredly reliable components and their intended sequence is verified.

15 Claims, 9 Drawing Figures

COMPONENT SEQUENCE VERIFIER

BACKGROUND OF THE INVENTION

This invention relates to component handling equipment, and more especially to mechanism for verifying component conformity to predetermined sequence. The invention is particularly adapted for relatively advancing successive elongated articles (for instance, coaxial lead type components) from a continuously operative conveyor to pass them through a processing or test station, and if qualified, to return them to the conveyor in unchanged order.

As disclosed in U.S. Pat. Nos. 3,669,309 and 3,971,193, for instance, large numbers of lead-bearing electronic components are predeterminedly sequenced by automatically controlled means for use in industry. In some cases the components may, when they have been arranged side by side in selected predetermined order, simply be interconnected by means of tapes for holding the components spaced for eventual sequential mounting in circuitry, and in other situations it may be that the components, when rearranged in required order (usually in repeating, similarly-sequenced groups), will be fed seriatim for further direct processing, for example, insertion in printed circuit boards. In-line sequencers in current commercial use may have a productive capacity in excess of 18,000 components per hour.

Component manufacturers have long provided equipment for testing their products (i.e. inspection for presence and specific electrical characteristics) prior to shipment to assembler's plants. The possibility of defects and damage arising during storage, in transit, or in subsequent handling dictates that precaution must be taken to avoid any occasional unsatisfactory electronic component finding its way into a circuit assembly so that the latter will not also prove faulty. It has additionally been known as disclosed in U.S. Pat. No. 3,236,374, for example, to provide, in combination with an intermittently operable conveyorized machine for sequencing axial lead type components, a component testing device adapted to function each time the conveyor stopped for this purpose. The necessity to frequently stop and start such apparatus incurs a decrease in output which cumulatively may be considerable and therefore undesirable.

Additional prior art disclosures are noted in U.S. Pat. Nos. 2,896,314, 3,073,446; 3,240,336; and 3,366,235.

SUMMARY OF THE INVENTION

In view of the foregoing, it is a main object of this invention to provide, in a high-speed component processing machine of the type having a stationary testing station for evaluating successive components of a series, improved mechanism for presenting each successive component to that station without interrupting continuity of operation of the machine.

Another object of this invention is to provide a sequencing machine wherein electronic components are continuously fed by a normally non-stop conveyor and a associated conveyor actuated means successively to and through a non-moving test station, the station being adapted to automatically evaluate the different components singly according to appropriate predetermined standards.

In accordance with these objects, a feature of the invention is to provide, in a machine for continuously sequencing electrical components and comprising a continuously moving conveyor and means adjacent to the conveyor for testing successive, spaced components carried thereby, a transfer device operable by the conveyor whereby each component approaching the testing means is relatively accelerated to enable the component to be positioned in the testing means and tested while stationary and then returned to its proper sequential position on the moving conveyor, the testing means being adapted automatically to stop the conveyor in the event of non-acceptability of a component under test.

BRIEF DESCRIPTION OF THE DRAWINGS

The foregoing and other objects and features of the invention will now be more particularly described in connection with an illustrative embodiment and with reference to the accompanying drawings thereof, in which.

DESCRIPTION OF THE PREFERRED EMBODIMENT

Although the embodiment herein selected for purposes of illustration pertains to usage of the invention in a machine programmed to produce electrically tested reels of sequenced components with lead-taped spacing to match requirements of component insertion machines, it will be appreciated that application of the invention is not necessarily thus limited. The invention may, for instance, be useful in dealing with successive components which are, or are not, electrically similar, and may even have more general utility in other fields, for example, in connection with rod-like articles to be successively inspected or processed at an off-conveyor station not necessarily involving inspection of their electrical character.

Figure 1:
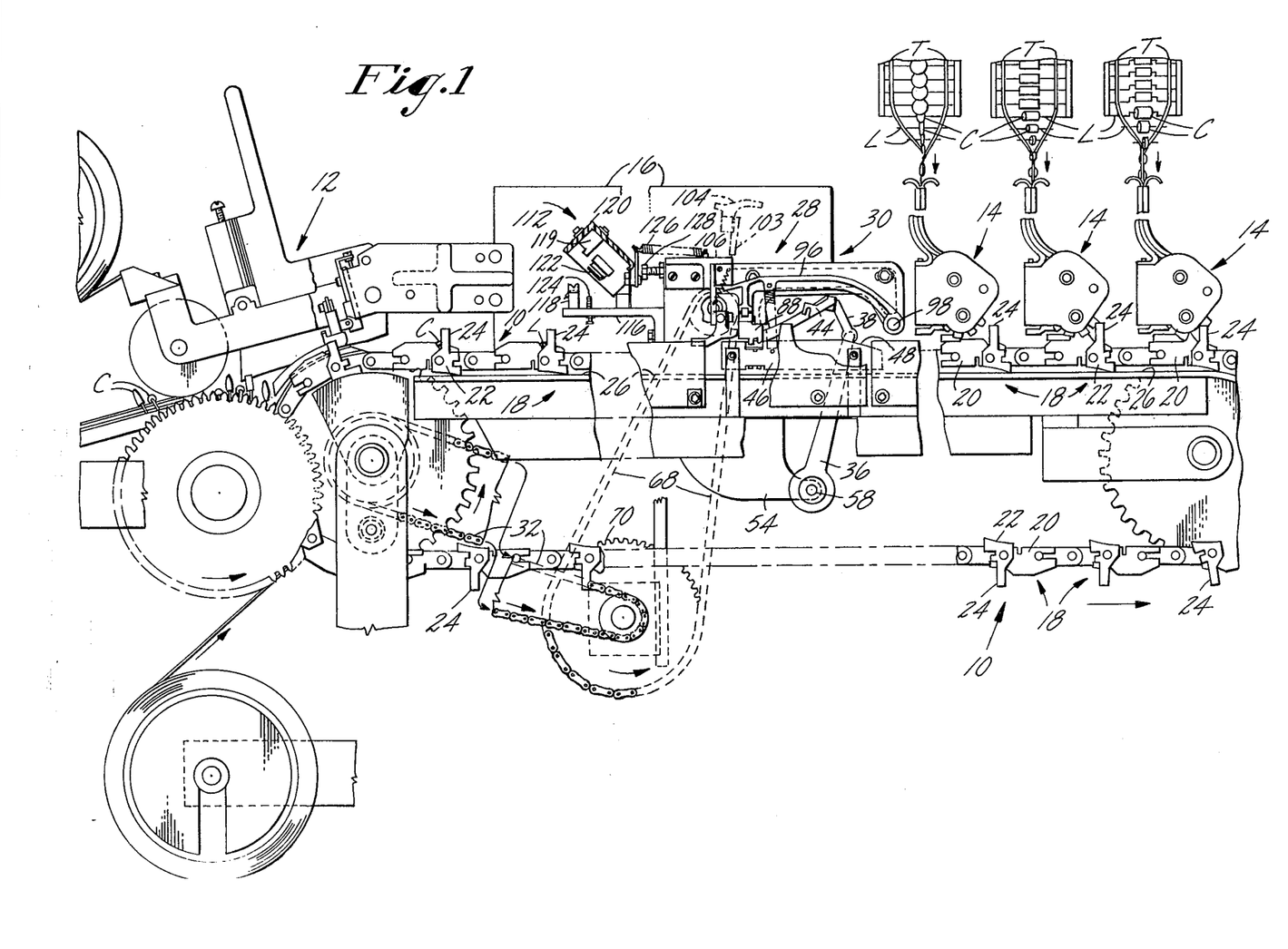
FIG. 1 is a view in side elevation, with portions broken away, of a component sequencing and taping machine having sequence testing or verifying mechanism according to this invention disposed along a continuously operable component conveyor.

As a matter of convenience and not by way of limitation, the invention will hereinafter be described as embodied in machines of the general type disclosed in the mentioned U.S. Pat. Nos. 3,669,309 and 3,971,193. These employ a continuously operative endless conveyor of chain-type generally designated 10 (FIGS. 1, 2, 6 and 8) for carrying in uniformly spaced, side by side, relation a succession of coaxial lead components C to be retaped and reeled at a processing station 12 (FIG. 1). It will be understood that the components C, initially fed by tapes T from their respective dispensers 14 arranged along the conveyor, are successively indexed and individually released to the conveyor according to programming means including an electronic measuring device 16 (FIG. 1), for example.

As herein shown a predeterminedly selected sequence of the electronically different components C, usually in a repeat order dictated by ultimate circuit board assembly requirements, will be moved by the conveyor 10 at high speed and continuously from right to left along the upper reach of the conveyor, though the components from one or more of the dispensers 14 may be substantially identical, both physically and electrically. The conveyor 10, the dispensers, and the station 12 may be assumed for purposes of convenience to correspond substantially to the patented structure referred to, it being noted that the conveyor comprises uniformly spaced, lead-engaging carriers generally designated 18 and including, respectively, a pair of leading side plates 20 and a pair of trailing pick-off plates 22. Pivotal relation of pick-off fingers or projections 24 of the plates 22 to the leading plates 20 is controlled by cam means which along the upper conveyor reach, constitutes a fixed, horizontal pair of parallel cam tracks 26 secured to the conveyor frame. It will thus be understood that upon passing from beneath delivery ends of the series of dispensers 14, each pair of upstanding fingers 24 is rapidly and continuously advancing a component C toward the station 12, but that it is highly important to ascertain, prior to re-taping or other processing at such station 12, that each component is verified as acceptable for its intended use. To this end, and at the same time to avoid any reduction in output of the continuously operative machine, an inspection or test station 28 (FIGS. 1,2,5) and component transfer mechanism 30 (FIGS. 2-5) is provided as will next be described.

The transfer mechanism 30 and test station 28 are located along the conveyor path upstream from the processing station 12 and downstream from the series of dispensers 14. The conveyor mechanism, as will be explained, is preferably actuated by power means (not fully shown here, but preferably including a motor, clutch-brake, and speed reducer) and a conveyor drive chain 32 (FIG. 1) continuously operating the transfer mechanism in established time relationship. Notably, since the test station 28 is to determine acceptability of each component while held immobile, and output of the machine is not to be diminished (assuming the components qualified) by lowering the speed or intermittent stopping of the conveyor, the transfer mechanism 30 is adapted to change component downstream velocity relative to that of the conveyor and its pick-off fingers 24. More particularly, the transfer mechanism preferably includes a four-bar linkage (FIGS. 4-8) including a short crank arm 34, a longer oscillatory crank arm 36, and a connecting rod 38 for accelerating downstream velocity of each component C to be presented to the fixed test station 28. (The relative advance of each pair of leads L with respect to its manually propelling fingers 24 is, of course, not so great as to overtake or interfere with the leads and components immediately preceding in the test station 28.) For this purpose a right-hand end of the connecting rod 38 is slotted at 40 (FIGS. 6-8) to secure thereto a cross bar 42 formed with a pair of widthwise-spaced, lead-engaging U-shaped pickers 44,44 respectively engageable with oppositely extending coaxial leads L,L of each component. Aligned with the cam tracks 26,26 is a pair of stationary cam plates 46,46 (FIGS. 1,2,5-8) extending in parallel ahead of and through the test station 28. Each plate 46 has an inclined lead-engaging ramp portion 48 disposed for cooperation with the successive fingers 24 thus to raise successive advancing component leads L heightwise of the conveyor, and onto a raised lead-supporting horizontal rail portion 50. The latter is cooperative with the pickers 44 as they are caused to receive the lifted leads L,L and to accelerate and decelerate them downstream relative to the fingers 24.

Figures 2, 3, 4:
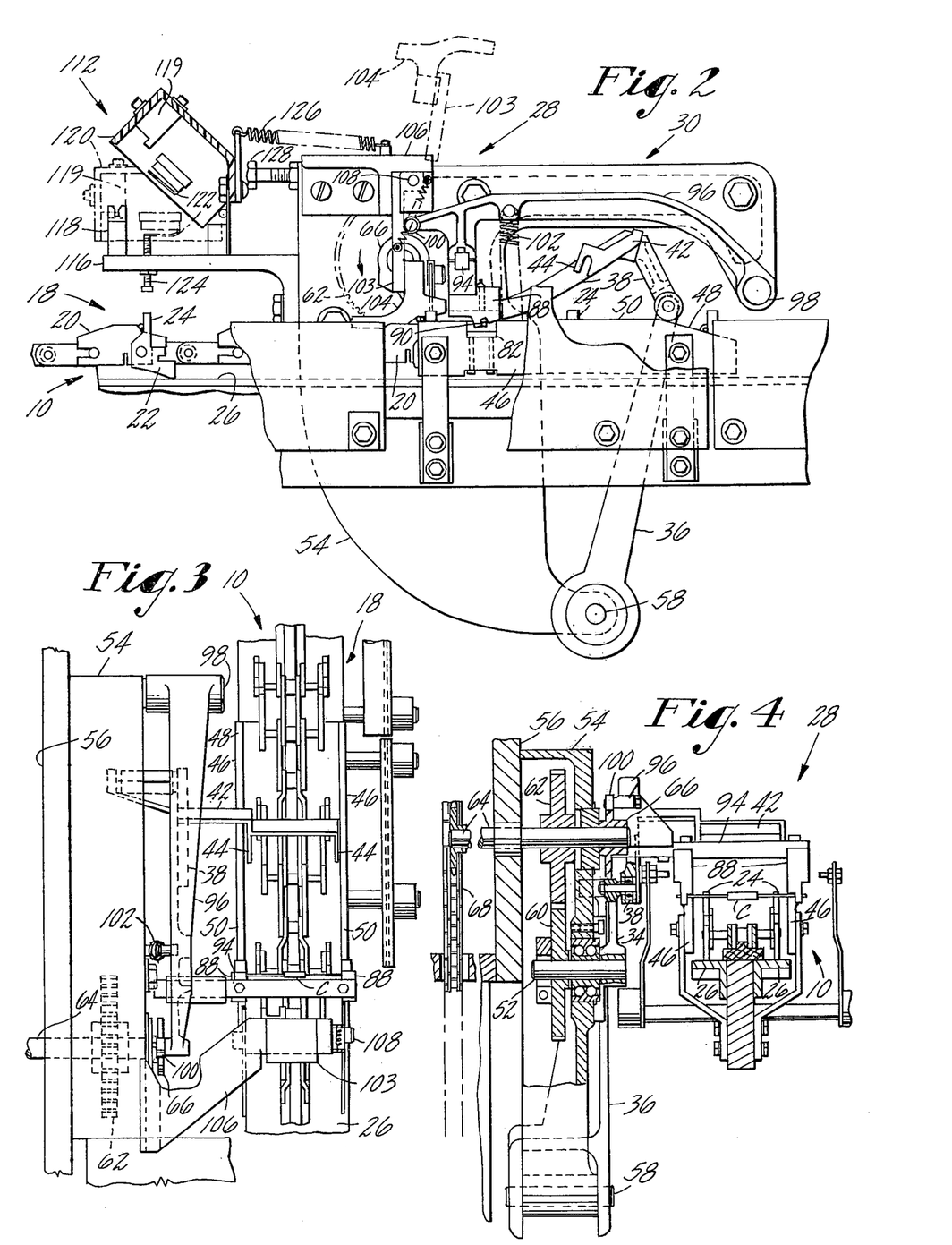
FIG. 2 is a view in side elevation and on a larger scale of portions of the verifying and component transfer mechanism shown in FIG. 1.
FIG. 3 is a plan view of the transfer and verifying mechanism.
FIG. 4 is a view in end elevation of parts shown in FIG. 3 but with portions broken away to show details of driving means for the transfer and verifier mechanism.
Figure 5:
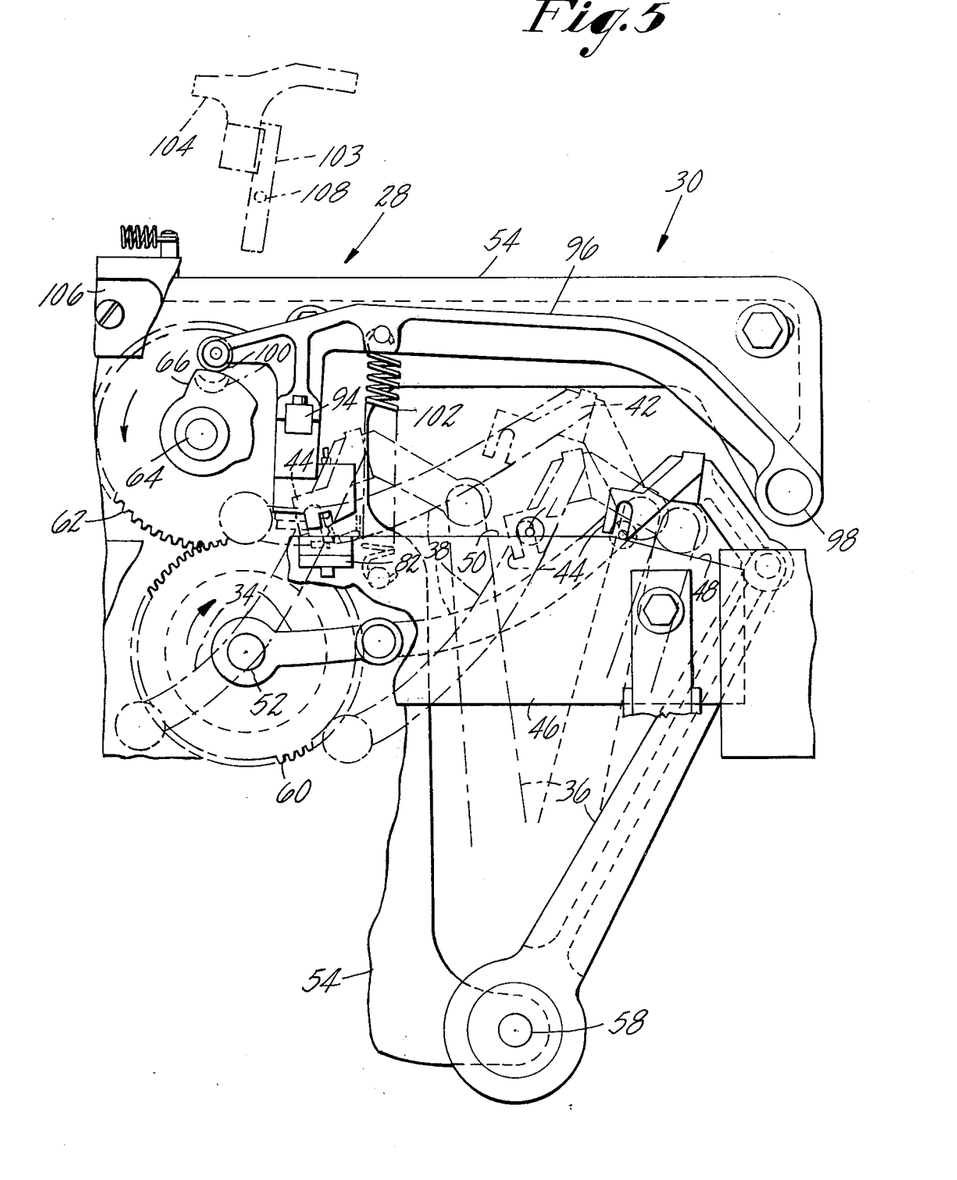
FIG. 5 is a view similar to FIG. 2 but on a larger scale to show successive positions of four-bar linkage parts of the driving means shown in FIG. 4.

Angular speed of the short or input crank arm 34 is derived from a rotary stub shaft 52 (FIGS. 4,5). The mentioned four-bar linkage 34,36,38, is such that when it has aligned each transferred component C with the test station 28 and ceased downstream motion, the fingers 24 are raised vertically to free that component and commence return or upstream movement for receiving the component arriving at the trailing end of the cams 50 and next to be tested. The stub shaft 52 is journalled in a gear housing 54 secured to a frame portion 56 of the machine. The housing 54 serves also to pivotally support the lower end of the crank arm 36 on a pin 58. Clockwise rotation of the crank arm 34 (FIGS. 5-8) and its shaft 52 is effected by means of a gear 60 (FIGS. 4,5) on that shaft meshing with a drive gear 62 journalled in the housing 54 on a shaft 64 which also rotatably carries a cam 66 for a purpose later mentioned. The shaft 64 is herein shown as being normally continuously driven in appropriate timed relation to the conveyor 10 by means of an endless chain 68 (FIGS. 1,6) passing over a lower sprocket 70, the hub of which is formed as a sprocket for the conveyor drive chain 32. (Means (not shown) is preferably provided for adjusting angular relationship of the driving shaft of the conveyor and a jackshaft portion of the transfer drive.) It will be understood that normally continuous drive of the chain 32 and timed operation of the station 28 and the mechanism 30 may be derived from mechanism other than a motor, a clutch-brake unit, and a reducer (not shown) as referred to in the cited U.S. Pat. No. 3,669,309.

Figures 7, 9:
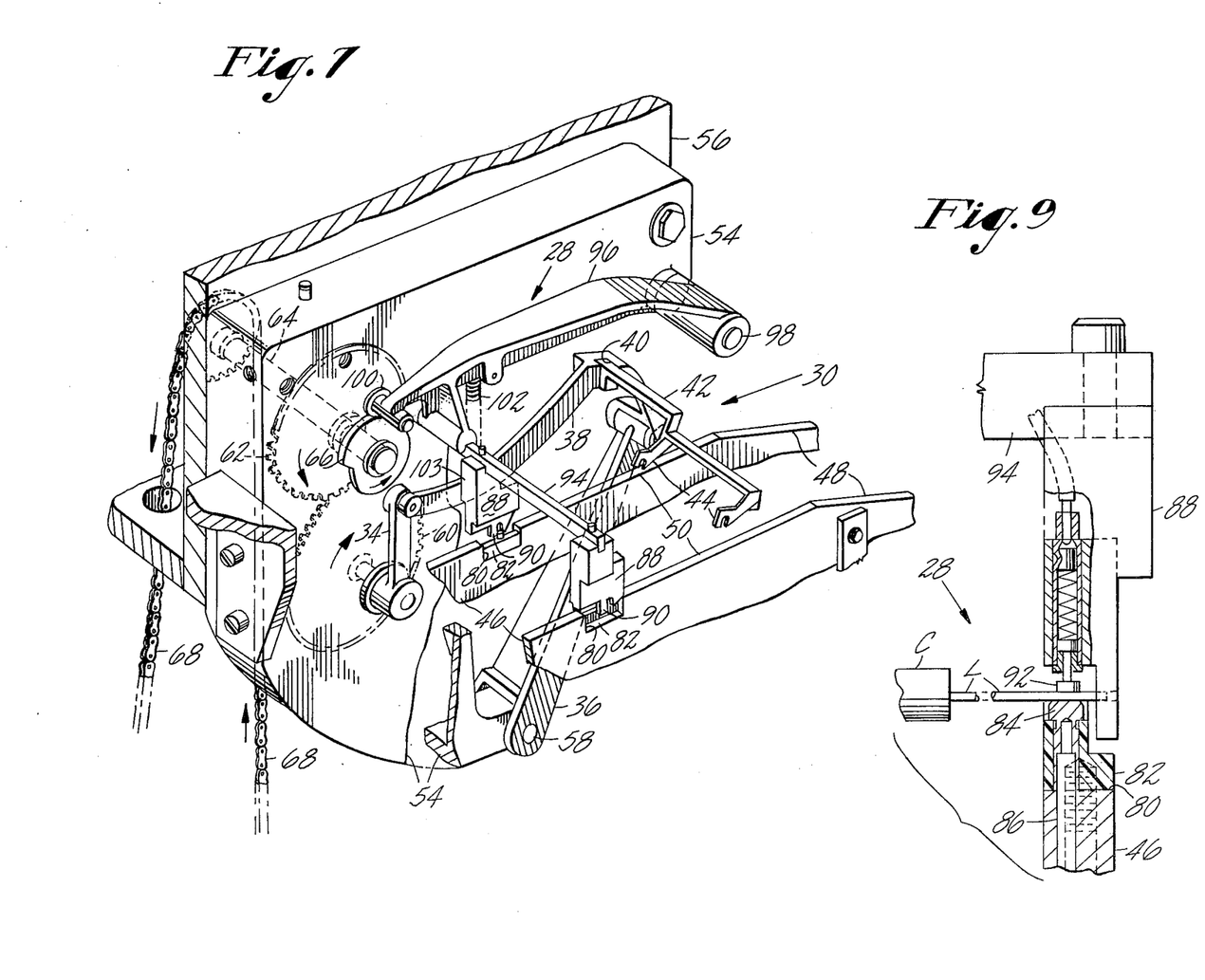
FIG. 7 is a perspective view of the component test station and associated transfer mechanism.
FIG. 9 is an enlarged detail view in end elevation of a lead under test at the automatic test station.

Structure of the test or inspection station 28 will next be described referring mainly to FIGS. 7-9, inclusive. Slots 80,80 respectively formed in the cam tracks 50 nest non-conductive blocks 82,82, each of which mounts a lead-engageably, conductive vertical contact or probe 84 as shown in FIG. 9. Upper ends of the probes are even with the tracks 50, and lower ends of the probes are connected to test circuit terminals 86, respectively. Cyclically cooperating with each of the probes 84 is a pair of upper, non-conductive clamps 88,88, the lower edges of which are formed with aligned lead receiving notches 90 and lead-engaging, upwardly yieldable conductive contact pins 92 (FIG. 9). It will be understood that appropriate current and voltage is directed to each component C when held clamped by its leads L being engaged by the pins 92,92, when lowered by the clamps 88. Control and timing of the test current and voltage are preferably derived from pulsing as dictated by the computer 16.

For cyclically lowering the contact pins 92,92 of the clamps 88,88 onto the leads L of each component just as the leads have been brought to a halt by the downstream side of the notches 90 as the pickers 44 arrive at the left-hand extremity of their travel, the clamps 88 are carried by a bar 94 (FIGS. 1,3,5–8) secured to a lever 96. The latter is fulcrumed at one end on a pin 98 secured to the housing 54. The other end of the lever 96 carries a follower roll 100 cooperative with the periphery of the mentioned cam 66, engagement between the cam and roll being maintained by a spring 102 interconnecting the lever 96 and a pin affixed to the housing 54. The high locality of the cam 66 elevates and holds the clamps 88 raised to release each tested component C when its lead-pushing fingers 24 catch up with it, assuming the component passes its electrical test. If it does not qualify for the usage contemplated, the computer 16 is not signalled (or is correspondingly signalled) and accordingly circuitry controlling the conveyor drive means is at once deenergized.

In the event of a component failing its test at the station 28, and the conveyor stopping with the unacceptable component C under clamps 88, a machine attendant may remove the unacceptable component by pivoting the lever 96 clockwise until the bar 94 abuts a fastener securing the housing 54 to the portion 56 of the machine. If the unacceptable component stops under the guide shoes 104, the attendant may swing clockwise an arm 103 carrying the pair of guide shoes 104 from their full-line operative position shown in FIGS. 1,2,6 and 8 to their upper, dotted-line out of the way inoperative position shown in FIGS. 1,2 and 5. For this purpose the arm 103 is pivoted on a pin 108 in a bracket 106 secured to the housing 54. A tension spring 110 normally urging the lower edge of the shoes 104 counterclockwise into lead engageable position (determined by abutment with the bracket 106) as test-passing components C are moved from the station 28 downstream again by their fingers 24, is connected at a lower end of the arm 103 and at its upper end to a pin 112. This pin 112 is so located relative to the pin 108 that the arm will yieldingly be held in its inoperative position (indicated by dotted lines in FIGS. 1,2,5) against a stop. Now the attendant can have access to readily remove an unacceptable component C and, after determining acceptability of a suitable substitute component C in an auxiliary test station 112 (FIGS. 1,2,8), the proper replacement for component C will be deposited in its carrier 18 and the machine restarted when the shoes 104 have again been lowered. Thus the pick-off fingers 24, which had been advancing a rejected component C, will now be cooperating with the under edges 114 of the guide shoes to restore the newly qualified component for travel at continuous, substantially constant conveyor speed in its pocket in the carrier 18.

Figure 8:
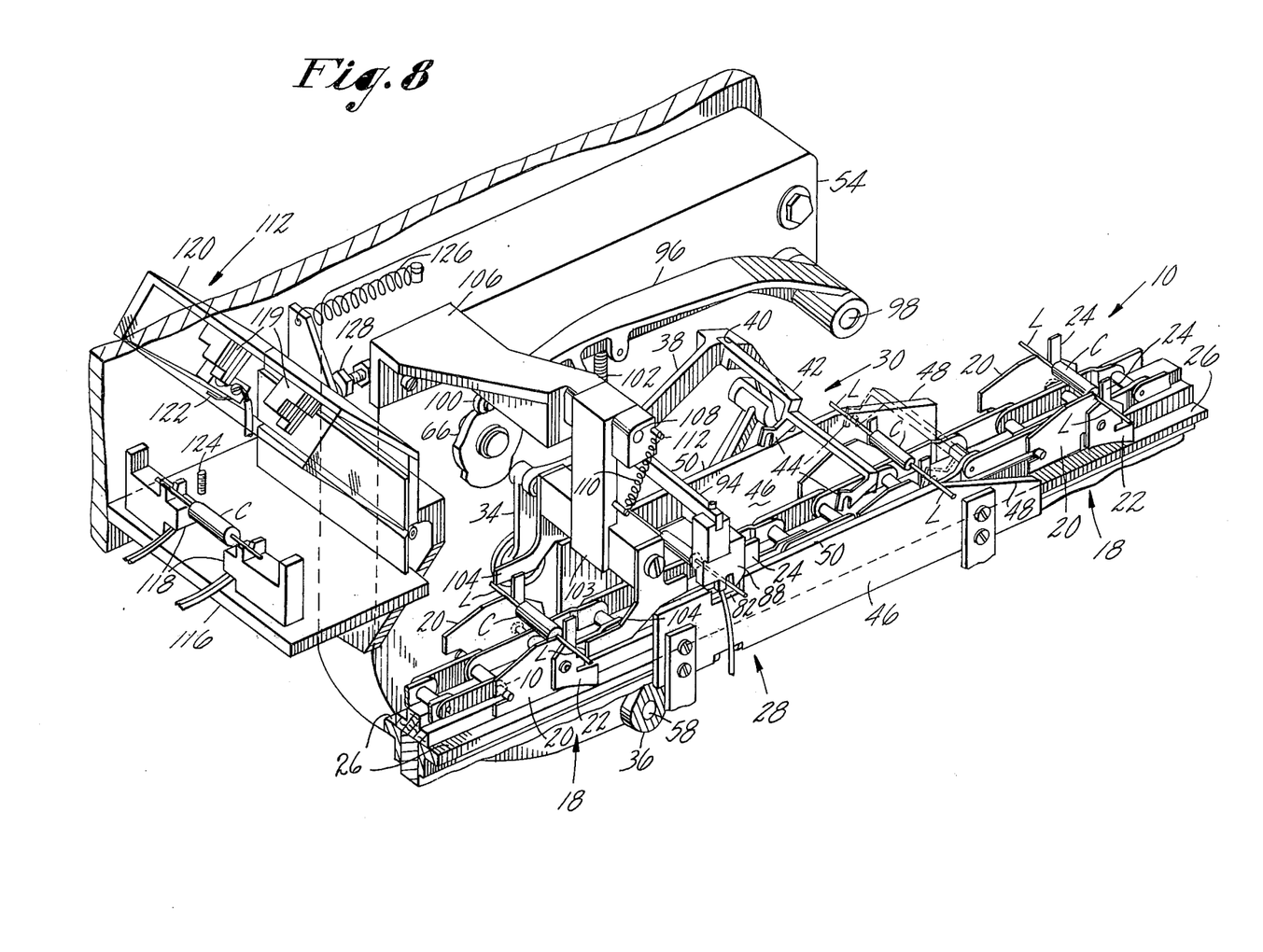
FIG. 8 is a view similar to FIG. 7 and indicating successive positions of the components as well as an auxilliary test station.

Referring to FIGS. 1,2 and 8, the auxilliary test station 112 may, of course, have different construction and location if desired, but will normally be adjacent to a convenient reserve supply (not shown) of the different substitutable components. As herein shown the station 112 comprises a bracket 116 secured to the housing 54 and supporting pairs of electrical test units 118 which may correspond to those provided and described for the automatic test station 28. Desirably the operator will, when necessary, simply place the new component to be tested with its leads in the notches of the lower units 118, and then bear down on a hinged cover 120 (preferably transparent) carrying upper lead clamping test blocks 119 (FIGS. 1,8) cooperative with the units 118. This encloses the new component and connects its leads in the testing circuitry by closing a contact 122 (FIGS. 1,8) of a switch mounted on the cover with an adjustable screw 124 threaded in the bracket 116. Acceptability of the new component is verified by read-out on the computer 16 prior to positioning that component in its appropriate carrier 18. A tension spring 126 interconnecting the housing 54 and a projection on the cover 120 biases the latter clockwise to open position against a stop 128 as indicated in FIGS. 1 and 2, to facilitate placement of the component in the station 112 and removal therefrom.

Briefly to review operation of the machine and more especially its associated component test station 28 and transfer mechanism 30, it will be assumed that the carriers 18 are respectively loaded with components C picked-off from the dispensers 14 by the pairs of fingers 24 and successively proceeding continuously downstream toward the station 28. The sequence of the leaded components has been appropriately predetermined by the computer 16 which will also successively control their proper electrical test and the timing of such tests at the station 28. It is important prior to reeling (or other processing) of the newly sequenced components at the station 12, to verify that no unacceptable component C is included and that elimination of such component be accomplished with minimum decrease in output of the machine.

On engagement of the leads of each component with ramp portions 48, it is raised to the level of the cam rails 50 by the front edges of the now-vertical fingers 24. Timing of the four-bar linkage 34,36,38 of the mechanism 30, is such that the pickers 44, as indicated in FIG. 5, are lowered over the pair of leads L preferably just as they reach the leading ends of the rail portions 50. Now the pickers 44 accelerate downstream to advance the component (while guided by the portions 50) ahead of its fingers 24 previously relied on for propulsion. The change in velocity imparted to each component by the transfer mechanism 30, and actuated by the power means normally continuously driving the conveyor 10 as hitherto noted, is for the purpose of enabling the test station 28 to operate automatically on the component being transferred when it becomes electrically insulated and stationary, thereby enabling the same component, when automatically tested, as "acceptable", to again be propelled by its fingers 24 without any stoppage of the machine.

Figure 6:
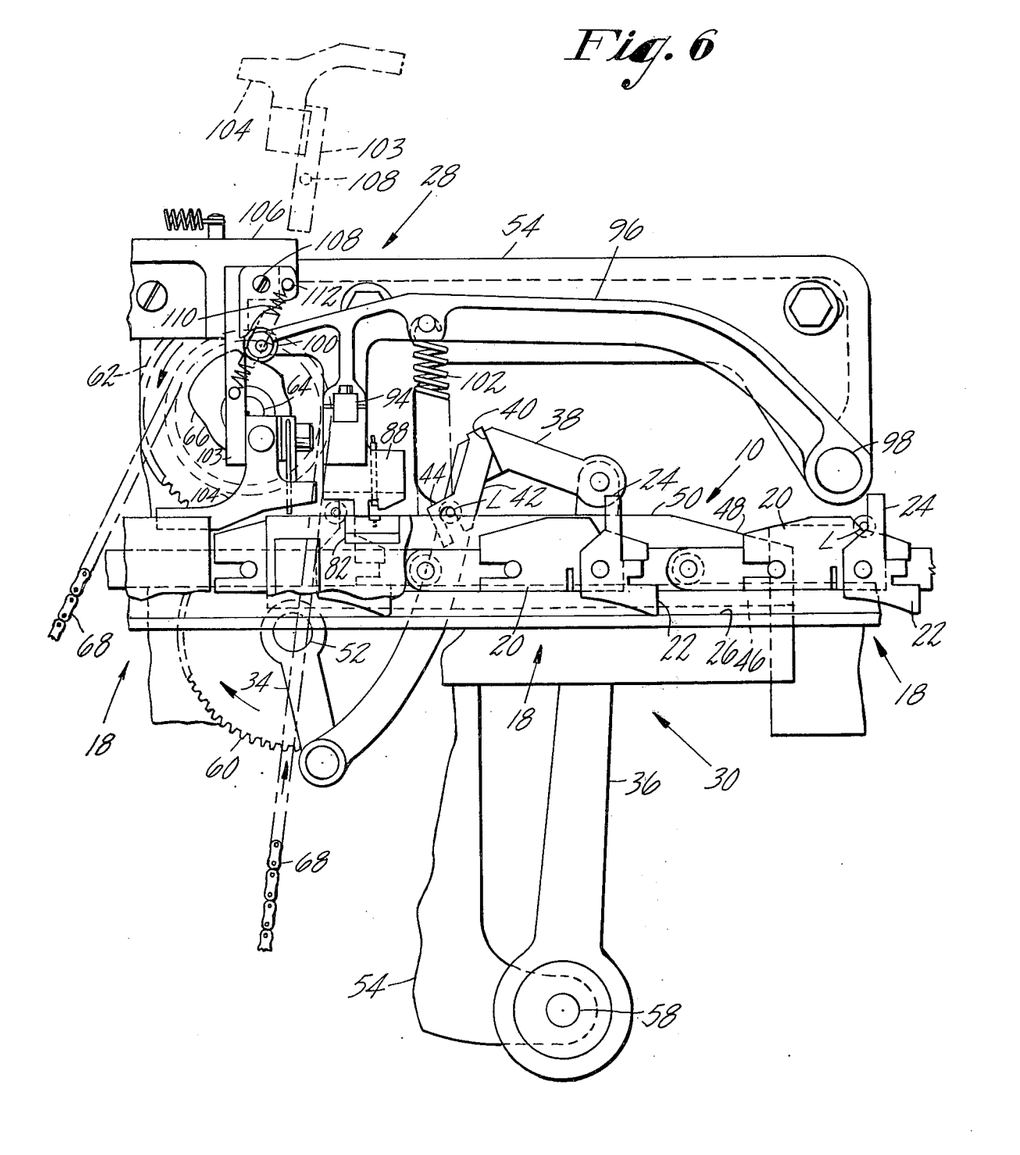
FIG. 6 is a view similar to FIG. 5 but indicating one component leaving the test station as another is about to be delivered thereto, and power connection of the conveyor drive to the transfer and verifier drives.

At the left-hand extremity of travel of the pickers 44, as shown in FIGS. 5 and 6, they will be raised vertically from the portions 50 and from the leads L which are then located upon the probes 84,84, respectively. Next, by reason of timed cooperation of a low region of the cam 66 with the follower roll 100, the clamps 88 are caused yieldingly to bring contact pins 92,92 into lead engagement with the stopped component. Satisfactory verification of that component's presence and electrical character by the test circuitry does not signal for any stoppage of the conveyor 10, but an unsatisfactory test at once terminates operation of the conveyor, the test station 28, the transfer mechanism 30, and the processing station 12.

Upon rectification of a defect and substitution of an acceptable component in the appropriate conveyor carrier 18 as above noted, reel up of the verified proper components may be continued. It will be appreciated that the transfer mechanism 30 and the test station 28 may be adapted for use directly with component insertion machinery or other processing equipment in lieu of taping-reeling as at the station 12. In any case, a continuous high output of "good" components in proper sequence is assured by the invention.

Having thus described our invention what we claim as new and desire to secure as Letters Patent of the United States is:

1. A machine for successively processing electronic components or the like comprising a continuously movable conveyor for carrying the components in sequential, spaced relation, a stationary component test or processing station adjacent to the operating path of the conveyor, and means for transferring successive components from their respective positions along the conveyor to present them downstream to the processing station and then restore them to said sequential conveyor positions, respectively, downstream from said station, said transfer means including mechanism for changing velocity of the components, respectively, as they are transferred relative to the conveyor whereby they can be presented individually to said station before being restored to said downstream positions on the conveyor without stopping or retarding its continuous movement during operation of the machine.

2. A machine as in claim 1 wherein said mechanism is adapted for accelerating the components and comprises a four-bar linkage.

3. A machine as in claim 1 wherein the means for transferring the components is operatively connected to mechanism for driving the conveyor.

4. A machine as in claim 1 comprising power means for driving the conveyor, and mechanism connected to said power means for cyclically effecting cooperation of the transfer means and the station.

5. A machine as in claim 1 wherein a plurality of component dispensers is disposed in alignment adjacent to the conveyor, programmable means for causing the dispensers to load the conveyor with components arranged in selected predetermined sequence, the processing station being located downstream of the dispensers and adapted to determine acceptability of the successive components from their electrical characteristics, respectively, and continued operation of said conveyor and transfer means being contingent on acceptability of each component in said sequence as determined by the processing station in response to operation of said programmable means.

6. A machine as in claim 5 wherein the dispensers are respectively actuatable to release a component to the conveyor by electrical pulsing controlled by the programmable means, and the actuation of said station is triggered by said pulsing.

7. A machine as in claim 5 wherein the conveyor comprises an endless chain including uniformly spaced pairs of fingers arranged to engage and advance oppositely extending leads of each component, and said transfer means includes ramp means cooperative with successive pairs of said fingers to raise the components heightwise relative to the chain and present them to said mechanism.

8. In a machine for handling components having leads in predetermined order and comprising a normally continuously operative conveyor, the conveyor including an endless belt or chain and uniformly spaced lead-engaging projections extending therefrom for advancing the components in succession along a path and toward a component processing station, a test station adjacent to the conveyor path and disposed ahead of the processing station, the test station having pairs of lead-engageable jaws for determining electrically the acceptability of each successive component, transfer mechanism for relatively advancing each component ahead of its lead-engaging projections as they approach the test station to align the leads of the transferred component with said jaws, power means for continuously operating the conveyor, mechanism for operating the transfer mechanism and said test station in time relation to said conveyor operating means, and means operable upon qualification of the component being tested at the test station for automatically returning the qualified component from the test station to lead-engaging relation with said projections immediately ahead of said processing station.

9. In combination with a normally continuously operable conveyor having a plurality of carriers spaced along its length for moving lead-bearing components, respectively, side by side and in predetermined sequence, a component test station having lead engageable means for electrically testing each component at a locality adjacent to the path of the conveyor, transfer mechanism ahead of the test station and cooperative with the successive carriers to disassociate and relatively advance each component with respect to its carrier and present the individual disassociated component in stationary condition to the test locality, and means operable in time relation to the conveyor for cyclically actuating the transfer mechanism and the test station to enable the latter to complete its test of a discrete component while relatively advanced and stationary before it is again received by its carrier.

10. The combination of claim 9 wherein the transfer mechanism comprises linkage cyclically operable to move lead-engageable component pickers downstream of each successive carrier to present a component at said locality just after the preceding component has dwelled thereat and then return for reception of the succeeding component from its carrier, and a pair of guide rails extending above the conveyor for cooperating with downwardly facing, aligned slots in said pickers to direct the leads of each component into said test station.

11. In a machine for sequentially processing coaxial lead type electrical components and including conveyor means continuously operable along a path, the conveyor means including uniformly spaced lead engageable projections upstanding from said path for successively advancing the respective components with substantially uniform velocity, a component test station adjacent to the path, means for operating the test station in time relation to the speed of the conveyor means, transfer mechanism operable upstream from the station for relatively advancing the successive components ahead of their respective lead-engaging projections to permit each advanced component to dwell during test at said station as the projections progress, first guide means cooperative with the successive projections to present each component to the transfer mechanism, guide rails cooperative with the transfer mechanism to deliver each component to said station, and other guide means immediately downstream of the test station and cooperative with said projections to enable each tested and acceptable component, after its dwell, to again be continuously moved by the conveyor.

12. A machine as in claim 11 wherein the transfer mechanism includes U-shaped pickers spaced widthwise of the conveyor path and movable lengthwise and heightwise thereof, and power means for cyclically actuating the transfer mechanism to cause said pickers to receive the leads of each component in the vincinity of a junction of the first guide means with said guide rails.

13. A machine as in claim 12 wherein said power means includes a four-bar linkage operatively connected to said means for operating the test station.

14. A machine as in claim 12 wherein said other guide means is mounted for movement between operative and out-of-the way inoperative positions to enable substitution of an acceptable component on the conveyor in lead-engaging relation to those of said projections which had respectively been advancing a component found unacceptable at the test station whereby proper sequence of only acceptable components is assured.

15. A verifier station for use with a high speed, coaxial lead type component sequencing machine having a conveyor for moving a plurality of components at substantially constant velocity in uniformly spaced relation along a path toward a taping and reeling station, and computer means for predeterminedly ordering the sequence of the components on the conveyor, the verifier station comprising a component testing means cyclically operable adjacent to the conveyor path in time relation to the conveyor speed, transfer mechanism ahead of the testing means for advancing successive components relative to their respective rest positions on the conveyor to a stationary position for testing at the verifier station by said testing means, circuit means connected to the verifier station and controlled by the computer means for determining, according to the predetermined sequence, acceptability of each component under test by said test means, and control means for rendering the conveyor, verifier station, and the transfer mechanism inoperative when a component fails to be electrically qualified as acceptable at said verifier station.

* * * * *